United States Patent [19]
Bennett

[11] 4,199,693
[45] Apr. 22, 1980

[54] COMPENSATED MOS TIMING NETWORK

[75] Inventor: Alton W. Bennett, Carlsbad, Calif.

[73] Assignee: Burroughs Corporation, Detroit, Mich.

[21] Appl. No.: 875,783

[22] Filed: Feb. 7, 1978

[51] Int. Cl.² .................. H03K 1/02; H03K 3/353
[52] U.S. Cl. .................................. 307/246; 307/297; 307/304
[58] Field of Search .................. 307/246, 297, 304

[56] References Cited

U.S. PATENT DOCUMENTS

| | | | |
|---|---|---|---|
| 3,673,430 | 6/1972 | Donoghue | 307/297 X |
| 3,806,742 | 4/1974 | Powell | 307/297 X |
| 3,823,332 | 7/1974 | Feryszka et al. | 307/297 |
| 3,970,875 | 7/1976 | Leehan | 307/297 X |
| 4,004,164 | 1/1977 | Cranford, Jr. et al. | 307/297 |
| 4,008,406 | 2/1977 | Kawagoe | 307/304 |
| 4,016,434 | 4/1977 | Defilippi | 307/297 |
| 4,049,980 | 9/1977 | Maitland | 307/297 X |
| 4,099,264 | 7/1978 | Lodi | 307/297 X |
| 4,128,775 | 12/1978 | Frederiksen | 307/297 X |

OTHER PUBLICATIONS

Baitinger, "Constant-Current Source Network", *IBM Tech. Disclosure Bull.;* vol. 13, No. 9, p. 2516; 2/1971.
Chang, "FET N-Channel Threshold Voltage-Control Circuit", *IBM Tech. Discl. Bull.;* vol. 17, No. 1, p. 140; 6/1974.
Hummel, "Sentry Circuit for Substrate Voltage Control", *IBM Tech. Discl. Bull.*, vol. 15, No. 2, pp. 478–479; 7/1972.

*Primary Examiner*—Larry N. Anagnos
*Attorney, Agent, or Firm*—Charles J. Fassbender; Mervyn L. Young; Kevin R. Peterson

[57] ABSTRACT

An MOS compensation circuit for stabilizing the discharge of a timing capacitor including first and second inverter circuits and an interconnecting feedback circuit which effectively compensate for impedance variances in a capacitor-discharging MOS transistor, particularly those impedance variances due to fabrication tolerance dependent parameters.

5 Claims, 3 Drawing Figures

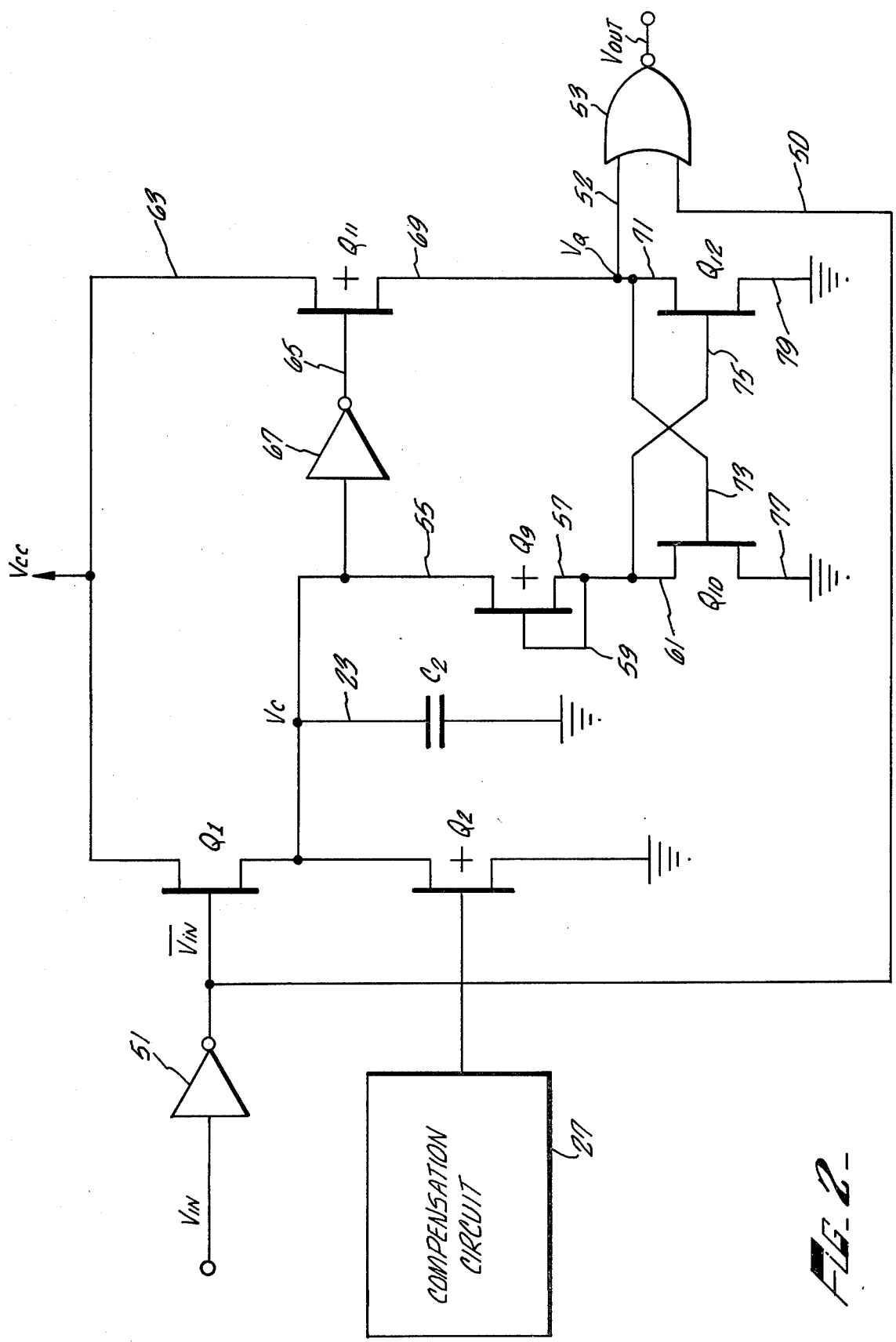

COMPENSATED MOS TIMING NETWORK

BACKGROUND OF THE INVENTION

The subject invention relates to circuitry for stabilizing the operation of electrical devices and more particularly to a circuit for stabilizing the operation of MOS devices subject to wide process parameter variations. The invention provides a compensation circuit particularly suitable for stabilizing the RC time constant of an MOS capacitor discharge timing circuit.

Large scale integrated fabrication of MOS circuitry has been achieved in many areas of circuit fabrication, and increasing use and reduction of circuit size remain as goals. Associated with large scale production of MOS devices are tolerances which for many purposes can be accomodated. However, where accurate timing circuits are necessary, these tolerances lead to problems. Parameter variations from MOS device to MOS device on the same or different integrated circuit chips have stood in the way of fabricating pulse generators and other circuits requiring precise control of timing circuits without resorting to precision components external to the chip on which the MOS devices reside.

SUMMARY OF THE INVENTION

It is therefore, an object of the invention to improve circuitry for compensating for parameter variations is MOS devices.

It is another object of the invention to provide an improved timing circuit.

It is another object of the invention to eliminate the need for precision external components to assure timing precision in an integrated MOS timing circuit.

It is yet another object of the invention to construct a compensation circuit for stabilizing the discharge of a timing capacitor entirely from MOS devices.

These and other objects of the invention are accomplished by provision of a compensation circuit which detects an undesirable impedance change in an MOS device through which a timing capacitor discharges. The compensation circuit responds to the impedance change by generating a compensating voltage for application to the MOS device. The compensation circuit is constructed entirely of MOS devices, and no precision external components are required.

BRIEF DESCRIPTION OF THE DRAWINGS

FIG. 2 is a circuit schematic of a monostable circuit employing the compensated timing circuitry of the preferred embodiment of the invention.

DETAILED DESCRIPTION OF THE PREFERRED EMBODIMENT

Figure 1:
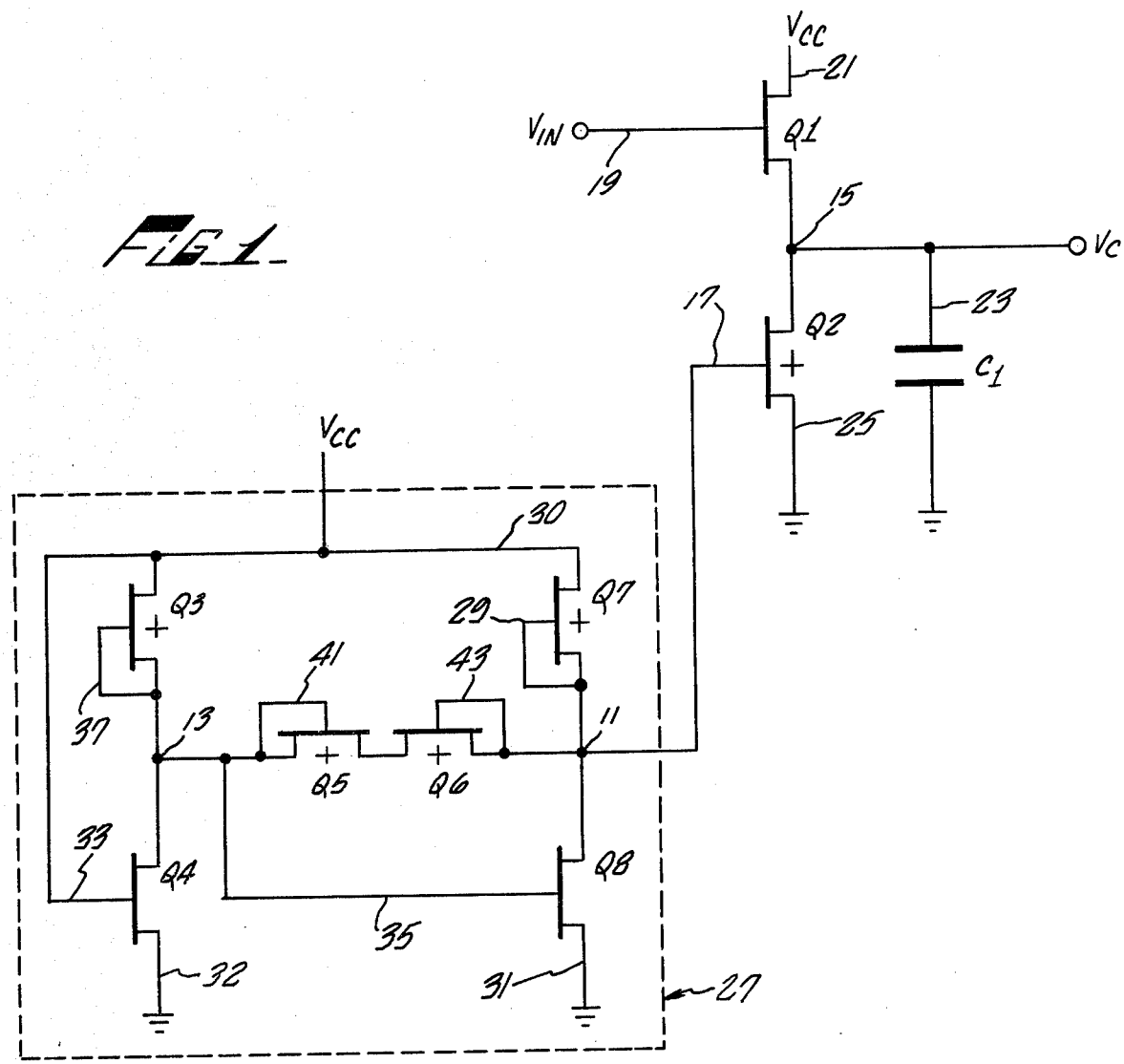
FIG. 1 is a circuit diagram of the compensation circuit of the preferred embodiment of the invention.

The preferred embodiment of the invention is illustrated in FIG. 1. The elements of the timing circuit of the preferred embodiment include a capacitor $C_1$ and a plurality of MOS devices $Q_1$, $Q_2$, $Q_3$, $Q_4$, $Q_5$, $Q_6$, $Q_7$, and $Q_8$. MOS devices $Q_2$, $Q_3$, $Q_5$, $Q_6$, and $Q_7$ are depletion devices as indicated by the plus sign (+), while MOS devices $Q_1$, $Q_4$ and $Q_8$ are enhancement type devices.

Devices $Q_1$, $Q_2$ and the capacitor $C_1$ comprise a typical prior art configuration for an RC discharge circuit. A control voltage $V_{in}$ is applied to the gate (control electrode) 19 of the first MOS device $Q_1$. A first non-control electrode 21 of the device $Q_1$ is connected to a reference voltage $V_{cc}$. The other noncontrol electrode of the device $Q_1$ is connected at a junction 15 to one terminal 23 of the capacitor $C_1$ and to one non-control electrode of the second MOS device $Q_2$. The other non-control electrode 25 of the second MOS device $Q_2$ is grounded.

In the prior art, the gate electrode 17 of the second MOS device $Q_2$ would be either connected to the point 15 or to the grounded electrode 25 depending on whether $Q_2$ was a depletion or enhancement device, respectively. When the capacitor $C_1$ is initially charged by an application of a gate voltage $V_{in}$ to the first MOS device $Q_1$, the necessary discharge current flows through the second MOS device $Q_2$. In such case, the RC time to discharge the capacitor $C_1$ is primarily adversely affected by wide process parameter variations for the second MOS device $Q_2$.

According to the preferred embodiment of the invention, however, the gate electrode of the second device $Q_2$ is connected to a compensation circuit 27. This compensation circuit 27 effectively controls the gate to source voltage of the MOS device $Q_2$. The compensation circuit 27 includes two inverters, one formed by MOS devices $Q_7$ and $Q_8$ and the other by MOS devices $Q_3$ and $Q_4$, as well as a feedback circuit formed by MOS devices $Q_5$ and $Q_6$.

The first inverter circuit includes two MOS devices $Q_7$, $Q_8$. A respective non-control electrode of each of the MOS devices $Q_7$ and $Q_8$ is connected at a node 11 as is the gate 29 of the MOS device $Q_7$. The second non-control electrode 30 of the MOS device $Q_7$ is connected to the source voltage $V_{cc}$, while the second non-control electrode 31 of the MOS device $Q_8$ is grounded.

The second inverter circuit is similarly formed by two MOS devices $Q_3$, $Q_4$, with the gate 33 of the device $Q_4$ being connected to the reference voltage $V_{cc}$. The gate 35 of the MOS device $Q_8$ in the first inverter circuit is connected at a node 13 where the gate 37 and one non-control electrode of the MOS device $Q_3$ join a non-control electrode of the MOS device $Q_4$. One non-control electrode 39 of the MOS device $Q_3$ is connected to the reference voltage $V_{cc}$, and one non-control electrode 32 of the MOS device $Q_4$ is grounded.

The feedback circuit includes two MOS devices $Q_5$, $Q_6$. The gate 41 and one non-control electrode of the MOS device $Q_5$ is connected to the node 13 in the second inverter circuit. The gate 43 and one non-control electrode of the MOS device $Q_6$ is connected to the first inverter circuit node 11. The remaining non-control electrodes of the two feedback circuit MOS devices $Q_5$ and $Q_6$ are connected together.

For accurate operation the transition time of the input voltage $V_{in}$ is made much faster than the discharge rate through the MOS device $Q_2$, and much greater than the threshold voltage $V_t$ of the first MOS device $Q_1$. Furthermore, the impedance $Z_{q1}$ of the first MOS device $Q_1$ is made much less than the impedance $Z_{q2}$ of the MOS device $Q_2$.

In operation, the operating point for the inverter formed by the MOS devices $Q_7$ and $Q_8$ is stabilized against parameter variations by the negative feedback provided by the MOS devices $Q_5$ and $Q_6$. If parameters vary to cause the capacitor $C_1$ to discharge more rapidly than desired, the gate voltage at the first inverter node 11 causes the impedance of the MOS device $Q_2$ to increase. For example, without the compensation circuit 27, if the parameter dependent voltage $V_{td}$ of the MOS device $Q_2$ were to increase, the impedance $Z_{q2}$ of the MOS device $Q_2$ would effectively drop, causing the capacitor $C_1$ to discharge rapidly. However, with the compensation circuit in place, when the parameter dependent voltage $V_{td}$ increases, the voltage at the second inverter node 13 in the compensation circuit 27 will increase towards $V_{cc}$, causing the inverted voltage at the first inverter node 11 to approach ground. As the second node voltage approaches ground, the impedance of the MOS device $Z_{q2}$ effectively increases and compensation is achieved.

FIG. 2 illustrates the use of the compensation circuit 27 in a mono stable type pulse shaper. The input voltage $V_{in}$ is inverted by an inverting amplifier 51 and supplied both to the MOS device $Q_1$ and the input 50 of a NAND gate 53. The timing capacitor $C_2$ has one terminal 23 connected to one non-control terminal 55 of an MOS device $Q_9$. The other non-control terminal 57 of the MOS device $Q_9$ is connected to its gate terminal 59 and to a non-control terminal 61 of a second MOS device $Q_{10}$. A third MOS device $Q_{11}$ has one non-control terminal 63 connected to the reference voltage $V_{cc}$. The gate 65 of the third MOS device is connected via a noninverting amplifier 67 to the terminal 23 of the timing capacitor $C_1$. The other non-control electrode 69 of the third MOS device $Q_{11}$ is connected to a non-control electrode 71 of a fourth MOS device $Q_{12}$ and to an input 52 to the NAND gate 53. The gates 73, 75 of the second and fourth MOS devices $Q_{10}$, $Q_{12}$ are cross-coupled to their respective ungrounded non-control terminals. The second respective noncontrol terminals 77, 79 of the second and fourth MOS devices $Q_{10}$, $Q_{12}$ are grounded.

Figure 3:
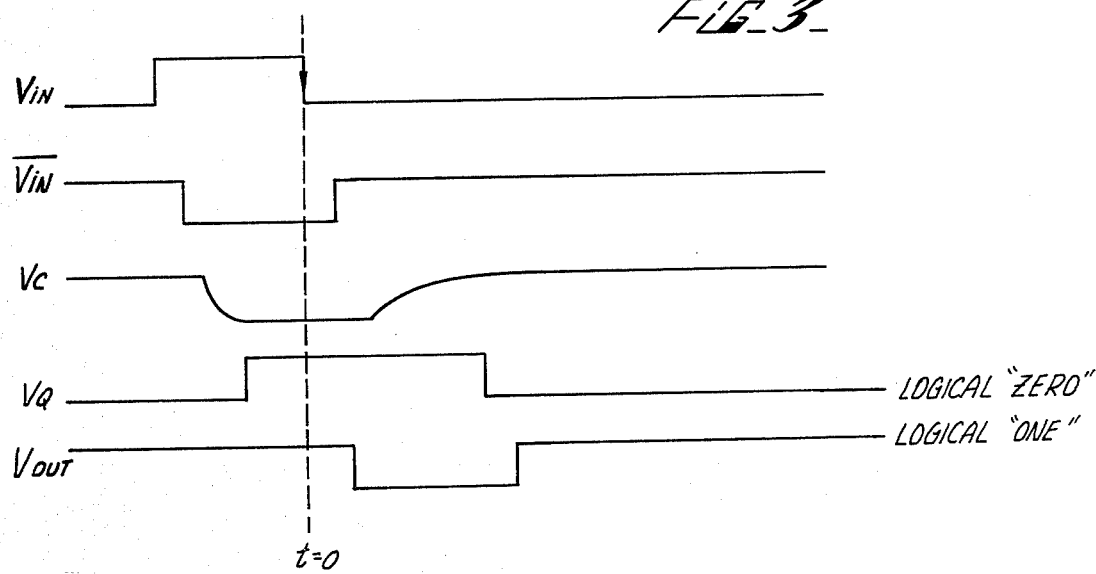
FIG. 3 illustrates waveforms useful in discussing the operation of the circuit of FIG. 2 implemented with PMOS devices.

The operation of the pulse shaper of FIG. 2 is illustrated by the timing diagrams of FIG. 3. Prior to time equals zero, $t=0$, the logical "zero" level of the input voltage pulse $V_{in}$ to the terminal of the input inverting amplifier 51 is inverted by that amplifier 51 and applied to the MOS device $Q_1$ and to one input of NOR gate 53. The output $V_{out}$ of NOR gate 53 is forced to the logical "zero" level. Also the MOS device $Q_1$ is turned on, thereby connecting the timing capacitor $C_1$ to the reference source $V_{cc}$. The timing capacitor voltage $V_c$ then begins to charge via the MOS device $Q_1$, its time constant being determined by the impedance of the device $Q_1$ and the capacitance of the timing capacitor $C_1$. When the capacitor $C_1$ has charged, the inverting amplifier 67 turns off the third MOS device $Q_{11}$ in the pulse shaper circuit. The voltage $V_Q$ on the terminal 52 then steps to the logical "zero" level. At $t=0$ when the initial pulse $V_{in}$ fed to the NOR gate 53 from the output of the first inverting amplifier 51 goes from the logical "zero" to the logical "one" state, both inputs to the NOR gate 53 are logical "zeros" and the output voltage $V_{out}$ of the NOR gate 53 drops to the logical "one" state. The capacitor $C_1$ begins a controlled discharge through MOS device $Q_2$, its time constant being determined by the device $Q_2$ and the capacitance of the timing capacitor $C_1$. When the capacitor voltage $V_c$ has discharged, the voltage $V_Q$ on the input 52 to the NOR gate 53 is a logical "ONE" and the output $V_{out}$ of the NOR gate 53 steps up, terminating the output pulse. The output voltage $V_{out}$ constitutes the desired timing pulse.

From the above discussion, it should be apparent that numerous modifications and adaptations may be made in the preferred embodiment without departing from the scope and spirit of the invention. It is therefore to be understood that, within the scope of the appended claims, the invention may be practiced other than as specifically described herein.

What is claimed is:

1. An MOS circuit comprising:
    a depletion MOS device having its first non-control electrode connected to a reference voltage and its gate and second non-control electrode connected to a first common point;
    an enhancement MOS device having its gate electrode connected to said first reference voltage, a first non-control electrode connected to said first common point and a second non-control electrode connected to a reference point;
    a second depletion MOS device having is first non-control electrode connected to said reference voltage and its gate and second non-control electrode connected to a second common point;
    a second enhancement MOS device having its gate connected to said first common point, one non-control electrode connected to said second common point and one non-control electrode connected to said reference point;
    a third depletion MOS device having its gate and one non-control electrode connected to said first common point, and a second non-control electrode; and
    a fourth depletion MOS device having its gate and one non-control electrode connected to said second common point and its second non-control electrode connected to the second non-control electrode of said third depletion MOS device.

2. A circuit according to claim 1 and further including:
    a capacitive means; and
    discharge means responsive to the voltage level of said second common point for discharging said capacitive means at a constant rate.

3. A circuit according to claim 2 wherein said discharge means is a single MOS device having a gate connected to said second common point, a first non-control electrode connected to said capacitor means, and a second non-control electrode connected to said reference point.

4. A circuit according to claim 3 and further including charging means for charging said capacitive means in response to an externally supplied control signal.

5. A circuit according to claim 4 wherein said charging means includes a single MOS device having a gate coupled to receive said control signal, a first non-control electrode connected to said capacitive means, and a second non-control electrode connected to said reference voltage.

* * * * *